US010592626B1

(12) United States Patent
Pednault et al.

(10) Patent No.: US 10,592,626 B1
(45) Date of Patent: Mar. 17, 2020

(54) VISUALIZING OR INTERACTING WITH A QUANTUM PROCESSOR

(71) Applicant: International Business Machines Corporation, Armonk, NY (US)

(72) Inventors: Edwin Peter Dawson Pednault, Cortlandt Manor, NY (US); Robert L. Wisnieff, Ridgefield, CT (US); Hyun Kyu Seo, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/155,489

(22) Filed: Oct. 9, 2018

(51) Int. Cl.
*G06F 17/50* (2006.01)
*G06F 15/80* (2006.01)
*G06N 10/00* (2019.01)

(52) U.S. Cl.
CPC ........ *G06F 17/5045* (2013.01); *G06F 15/803* (2013.01); *G06F 17/5072* (2013.01); *G06F 17/5081* (2013.01); *G06N 10/00* (2019.01)

(58) Field of Classification Search
CPC ........ G06N 10/00; G06N 20/00; G06N 99/00; G06N 3/0472; G06N 7/005; G06N 3/08; G06N 3/088; G06N 5/003; G06N 3/126; G06F 15/82; G06F 17/5009; G06F 15/76; G06F 17/18; G06F 17/00; G06F 9/44; G06F 17/5036; G06F 17/505; G06F 8/443; G06F 8/447
USPC .................. 716/30, 100–103, 111–112, 132; 703/2–3, 13–14, 22, 23
See application file for complete search history.

(56) References Cited

U.S. PATENT DOCUMENTS

| 8,195,596 B2 | 6/2012 | Rose et al. |
| 9,710,758 B2 | 7/2017 | Bunyk et al. |
| 2005/0182614 A1* | 8/2005 | Meredith ............... G06N 10/00 703/21 |

(Continued)

FOREIGN PATENT DOCUMENTS

WO     2017214331 A1     12/2017

OTHER PUBLICATIONS

Bunyk, et al., "Architectural Considerations in the Design of a Superconducting Quantum Annealing Processor," IEEE Transactions on Applied Superconductivity, vol. 24, No. 4, Aug. 2014, 10 pages.

(Continued)

*Primary Examiner* — Nghia M Doan
(74) *Attorney, Agent, or Firm* — Amin, Turocy & Watson, LLP

(57) ABSTRACT

Techniques and a system for visualization or interaction with a quantum processor are provided. In one example, a system includes a quantum programming component and a visualization component. The quantum programming component manages a quantum programming process to generate topology data for a quantum processor that is indicative of a physical topology of a set of qubits associated with the quantum processor. The visualization component generates visualization data for the topology data that comprises a set of planar slice elements arranged to correspond to the physical topology of the set of qubits. The set of planar slice elements indicate one or more operations performed at a time step associated with the quantum programming process.

20 Claims, 10 Drawing Sheets

(56) References Cited

U.S. PATENT DOCUMENTS

2017/0300817 A1   10/2017  King et al.
2018/0240033 A1    8/2018  Leek
2018/0246848 A1*   8/2018  Douglass .............. G06F 15/803

OTHER PUBLICATIONS

Mell, et al., "The NIST Definition of Cloud Computing," NIST Special Publication 800-145, Sep. 2011, 7 pages.

International Search Report and Written Opinion for International Application No. PCT/EP2019/075056 dated Dec. 18, 2019, 13 pages.

Patrzyk, et al., "Towards a Novel Environment for Simulation of Quantum Computing", Computer Science, vol. 16, No. 1, Jan. 1, 2015 (Jan. 1, 2015), p. 103, XP055650710, ISSN: 1508-2806, DOI : 10.7494/csci.2015.16.1.103, abstract, figures 4-6, sections 7.1, 9 and 10.

Larose, "Overview and Comparison of Gate Level Quantum Software Platforms", ARXIV.Org, Cornell University Library, 201, Olin Library Cornell University Ithaca, NY 14853, Jul. 6, 2018 (Jul. 6, 2018), XP081244858, section II.B and III.D(b), appendix C, figure 8.

* cited by examiner

VISUALIZING OR INTERACTING WITH A QUANTUM PROCESSOR

BACKGROUND

The subject disclosure relates to quantum circuits (e.g., quantum processors), and more specifically, to quantum circuit design. Quantum computing employs quantum physics to encode information rather than binary digital techniques based on transistors. For example, a quantum circuit can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum circuit can employ qubits to encode information rather than binary digital techniques based on transistors. However, design of a quantum circuit is generally difficult and/or time consuming as compared to conventional binary digital devices. As such, a user interface can be employed to facilitate design of a quantum circuit. In one example, Douglass et al., U.S. Patent Publication No. 2018/0246848, discloses that "a topology or hardware graph of a quantum processor is modifiable, for example prior to embedding of a problem, for instance by creating chains of qubits, where each chain which operates as a single or logical qubit to impose a logical graph on the quantum processor. A user interface (UI) allows a user to select a topology suited for embedding a particular problem or type of problem, to supply parameters that define the desired topology, or to supply or specify a problem graph or problem definition from which a processor-based system determines or selects an appropriate topology or logical graph to impose." However, it is difficult and/or time consuming to design a quantum circuit using conventional user interfaces such as, for example, the user interface disclosed by Douglass et al.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products for facilitating visualization and/or interaction with a quantum processor are described.

According to an embodiment, a system can comprise a quantum programming component and a visualization component. The quantum programming component can manage a quantum programming process to generate topology data for a quantum processor that is indicative of a physical topology of a set of qubits associated with the quantum processor. The visualization component can generate visualization data for the topology data that comprises a set of planar slice elements arranged to correspond to the physical topology of the set of qubits. The set of planar slice elements can indicate one or more operations performed at a time step associated with the quantum programming process. The system can provide various advantages as compared to conventional quantum processor design techniques. In certain embodiments, the system can provide improved visual symmetry and/or improved detection of patterns in quantum programming algorithms for a quantum processor. In an embodiment, the visualization component can provide a set of nodes and a set of edges associated with the set of planar slice elements. The set of nodes can represent the set of qubits. The set of edges can represent a set of connections between qubits from the set of qubits. In another embodiment, the visualization can be first visualization data, and the visualization component can generate second visualization data for assembly code associated with the quantum programming process. In yet another embodiment, the visualization component can display the first visualization data associated with the set of planar slice elements in parallel to the second visualization data associated with the quantum programming process via a user interface. In certain embodiments, an interaction component can provide an interaction via a user interface between the visualization data and the quantum programming process. In an embodiment, the interaction component can modify the quantum programming process based on a modification of the visualization data. In another embodiment, the interaction component can modify the visualization data or assembly code associated with the quantum programming process based on a scrolling action associated with the user interface. In yet another embodiment, the interaction component can modify the visualization data based on modification of assembly code associated with the quantum programming process. In certain embodiments, the visualization component can generate different topologies for different quantum processors. In certain embodiments, the visualization component can generate the visualization data via a cloud-based quantum computing platform. In certain embodiments, the visualization component can render the visualization data via digital video processing. In certain embodiments, the visualization component can generate the visualization data to reduce an amount of processing for a design process associated with the quantum processor.

According to another embodiment, a computer-implemented method is provided. The computer-implemented method can comprise managing, by a system operatively coupled to a processor, a quantum programming process to generate topology data for a quantum processor that is indicative of a physical topology of a set of qubits associated with the quantum processor. The computer-implemented method can also comprise generating, by the system, visualization data for the topology data that comprises a set of planar slice elements arranged to correspond to the physical topology of the set of qubits, wherein the set of planar slice elements indicate one or more operations performed at a time step associated with the quantum programming process. Furthermore, the computer-implemented method can comprise providing, by the system, an interaction via a user interface between the visualization data and the quantum programming process. The computer-implemented method can provide various advantages as compared to conventional quantum processor design techniques. In certain embodiments, the computer-implemented method can provide improved visual symmetry and/or improved detection of patterns in quantum programming algorithms for a quantum processor. In an embodiment, the computer-implemented method can also comprise modifying, by the system, the visualization data in response to a determination that the interaction satisfies a defined criterion. In another embodiment, the computer-implemented method can also comprise modifying, by the system, the quantum programming process in response to a determination that the interaction satisfies a defined criterion. In yet another embodiment, the providing the interaction via the user interface can comprise synchronizing at least a portion of the visualization data and assembly code associated with the quantum programming process. In yet another embodiment, the providing the interaction via the user interface can comprise reducing an amount of processing for a design process associated with the quantum processor.

According to yet another embodiment, a computer program product for facilitating interaction with a quantum processor can comprise a computer readable storage medium having program instructions embodied therewith. The program instructions can be executable by a processor and cause the processor to manage, by the processor, a quantum programming process to generate topology data for a quantum processor that is indicative of a physical topology of a set of qubits associated with the quantum processor. The program instructions can also cause the processor to generate, by the processor, visualization data for the topology data that comprises a set of planar slice elements arranged to correspond to the physical topology of the set of qubits, wherein the set of planar slice elements indicate one or more operations performed at a time step associated with the quantum programming process. Furthermore, the program instructions can cause the processor to provide, by the processor, an interaction via a user interface between the visualization data and assembly code associated with the quantum programming process. The computer program product can provide various advantages as compared to conventional quantum processor design techniques. In certain embodiments, the computer program product can provide improved visual symmetry and/or improved detection of patterns in quantum programming algorithms for a quantum processor. In an embodiment, the program instructions can also cause the processor to modify, by the processor, the visualization data in response to a determination that the interaction satisfies a defined criterion. In another embodiment, the program instructions can also cause the processor to modify, by the processor, the assembly code associated with the quantum programming process in response to a determination that the interaction satisfies a defined criterion.

DETAILED DESCRIPTION

Figure 1:
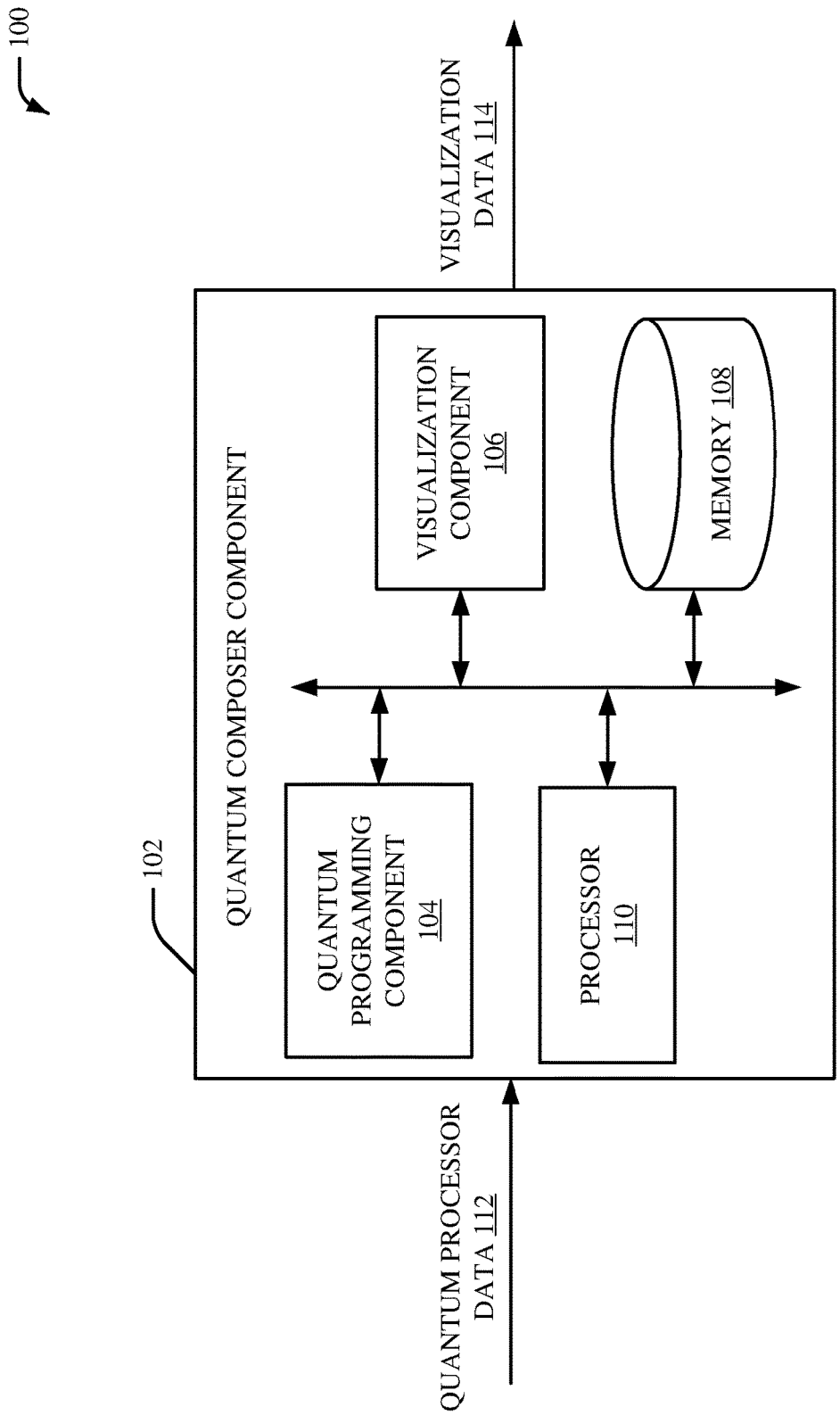
FIG. 1 illustrates a block diagram of an example, non-limiting system that includes a quantum composer component in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Quantum computing employs quantum physics to encode information rather than binary digital techniques based on transistors. For example, a quantum circuit can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum processor can employ qubits to encode information rather than binary digital techniques based on transistors. However, design of a quantum processor is generally difficult and/or time consuming as compared to conventional binary digital devices. As such, a design process for a quantum processor and/or simulation of a quantum processor can be improved.

To address these and/or other issues associated with conventional quantum processor design systems, embodiments described herein include systems, computer-implemented methods, and computer program products for visualization and/or interaction with a quantum processor. In an aspect, a quantum algorithm visualization can be provided to allow a user to navigate through one or more quantum algorithms for a quantum processor in different phases of time while also visualizing at least a portion of a topology for the quantum processor. For instance, a quantum algorithm visualization can be provided to allow a user to navigate through one or more quantum algorithms for a quantum processor in different phases of time while also seeing different gates of the quantum processor. The quantum algorithm visualization can be provided, for example, via a graphical user interface associated with a cloud-based quantum computing platform. In another aspect, the quantum algorithm visualization can also illustrate apparent visual symmetry and/or patterns in a quantum algorithm and/or a quantum processor not previously obtainable in a conventional design process for a quantum processor. Additionally or alternatively, a user can synchronously navigate the quantum algorithm visualization and/or assembly code for the quantum processor. In an embodiment, the quantum algorithm visualization can be a topological representation (e.g., per physical quantum processor) that can be manipulated to create and/or edit a quantum algorithm. In certain embodiments, the quantum algorithm visualization can be navigated via scrolling (e.g., a scrolling interaction) to view different phases of a quantum processor and/or assembly code associated with the quantum processor. In an aspect, in response to a specific qubit of a quantum processor being selected via the quantum algorithm visualization, a secondary visualization can be provided to a user that focuses on and/or isolates the selected qubit and one or more other entangled qubits of the quantum processor. In certain embodiments, the quantum algorithm visualization also can display a quantum algorithm in multiple views as well as offer synchronized scrolling that matches scrolling of the assembly code and the quantum algorithm visualization. In one example, display of the quantum algorithm in multiple views can be provided concurrently. In another example, display of the quantum algorithm and visualization of the quantum processor can be provided concurrently. In certain embodiments, at least a portion of the quantum algorithm visualization can be provided via digital video processing. In an embodiment, a graphical user interface associated with quantum programming (e.g., a quantum programming process) can provide a set of planar slice elements having nodes and edges arranged to reflect a physical topology of a set of qubits for a quantum processor. The nodes can represent qubits and the edges can represent connections between the qubits. Furthermore, the set of planar slice elements can indicate one or more operations being performed at a time step associated with the quantum programming (e.g., the quantum programming process).

As such, visualization and/or interaction with a quantum processor as disclosed herein can provide various solutions to overcome the aforementioned problems associated with conventional quantum processor design systems and/or other conventional technologies. For example, an amount of time to design and/or simulate a quantum processor can be reduced. Furthermore, an amount of computational resources employed to design and/or simulate a quantum processor can be reduced. Design of a quantum processor, quantum programming associated with a quantum processor, and/or simulation of a quantum processor can also be optimized. Additionally, accuracy of a quantum processor system and/or efficiency of a quantum processor system can be improved. Moreover, quality of a quantum processor can be improved, performance a quantum processor can be improved, efficiency of a quantum processor can be improved, timing characteristics of a quantum processor can be improved, power characteristics of a quantum processor can be improved, and/or another characteristic of a quantum processor can be improved.

FIG. 1 illustrates a block diagram of an example, non-limiting system 100 for visualization and/or interaction with a quantum processor in accordance with one or more embodiments described herein. In various embodiments, the system 100 can be a quantum composer system associated with technologies such as, but not limited to, quantum processor technologies, quantum programming technologies, quantum processor modeling technologies, quantum processor simulation technologies, quantum computing design technologies, qubit technologies, quantum circuit technologies, artificial intelligence technologies and/or other technologies. The system 100 can employ hardware and/or software to solve problems that are highly technical in nature, that are not abstract and that cannot be performed as a set of mental acts by a human. Further, in certain embodiments, some of the processes performed may be performed by one or more specialized computers (e.g., one or more specialized processing units, a specialized computer with a quantum composer component, etc.) for carrying out defined tasks related to quantum processor design and/or quantum processor simulation. The system 100 and/or components of the system 100 can be employed to solve new problems that arise through advancements in technologies mentioned above, computer architecture, and/or the like. One or more embodiments of the system 100 can provide technical improvements to quantum processor systems, quantum programming systems, quantum processor modeling systems, quantum processor simulation systems, quantum computing design systems, qubit systems, quantum circuit systems, artificial intelligence systems and/or other systems. One or more embodiments of the system 100 can also provide technical improvements to a quantum processor (e.g., a quantum circuit) by improving processing performance of the quantum processor, improving processing efficiency of the quantum processor, improving processing characteristics of the quantum processor, improving timing characteristics of the quantum processor and/or improving power efficiency of the quantum processor.

In the embodiment shown in FIG. 1, the system 100 can include a quantum composer component 102. As shown in FIG. 1, the quantum composer component 102 can include a quantum programming component 104 and a visualization component 106. Aspects of the quantum composer component 102 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the quantum composer component 102 can also include memory 108 that stores computer executable components and instructions. Furthermore, the quantum composer component 102 can include a processor 110 to facilitate execution of the instructions (e.g., computer executable components and corresponding instructions) by the quantum composer component 102. As shown, the quantum programming component 104, the visualization component 106, the memory 108 and/or the processor 110 can be electrically and/or communicatively coupled to one another in one or more embodiments.

The quantum composer component 102 (e.g., the quantum programming component 104 of the quantum composer component 102) can receive quantum processor data 112. The quantum processor data 112 can be, for example, a machine-readable description of a quantum processor. The quantum processor can be a model for one or more quantum computations associated with a sequence of quantum gates. In one example, the quantum processor data 112 can include textual data indicative of a text-format language (e.g., a QASM text-format language) that describes a quantum processor. For instance, the textual data can, for example, textually describe one or more qubit gates of a quantum processor associated with one or more qubits. In an embodiment, the quantum processor data 112 can additionally include marker data indicative of information for one or more marker elements that tag one or more locations associated with a quantum processor. For example, the marker data can include one or more marker elements that tag a location of one or more qubit gates of a quantum processor associated with one or more qubits. The quantum processor can be a machine that performs a set of calculations based on principle of quantum physics. For example, the quantum processor can encode information using qubits. In an aspect, the quantum processor can execute a set of instruction threads associated with data.

The quantum programming component 104 can manage a quantum programming process associated with the quantum processor. The quantum programming process can assemble a sequence of instructions (e.g., one or more quantum programs) that can be executed on the quantum processor. In an aspect, the quantum programming component 104 can manage the quantum programming process to generate topology data for the quantum processor. The topology data can be indicative of a physical topology of a set of qubits associated with the quantum processor. In an aspect, the quantum programming process can manage the quantum processor data 112. For instance, the quantum programming process can manage assembly code associated with the quantum processor data 112. The assembly code can include the textual data indicative of the text-format language (e.g., the QASM text-format language) that describes the quantum processor. In an example, the assembly code can textually describe one or more qubit gates of the quantum processor. In certain embodiments, the quantum programming process can generate at least a portion of the quantum processor data 112. The visualization component 106 can generate visualization data 114 for the topology data. The visualization data 114 can include, for example, a set of planar slice elements arranged to correspond to the physical topology of the set of qubits for the quantum processor. The set of planar slice elements can indicate one or more operations performed at a time step associated with the quantum programming process. Additionally or alternatively, the visualization data 114 can include a set of nodes associated with the set of planar slice elements and/or a set of edges associated with the set of planar slice elements. The set of nodes can represent the set of qubits for the quantum processor. The set of edges can represent a set of connections between qubits from the set of qubits. In an aspect, the topology data can be formatted as graphical data for the quantum processor. The graphical data can be indicative of a graphical representation of the quantum processor. In an embodiment, the graphical representation can be formatted as a hypergraph. For example, the graphical data can graphically represent the quantum processor as a hypergraph. The hypergraph for the quantum processor can include the set of nodes and a set of edges. The set of nodes can be a set of vertices (e.g., a set of points) of the hypergraph. The set of edges can connect two or more nodes from the set of nodes. In an aspect, a node of the hypergraph can represent a tensor associated with the quantum processor. For example, a gate of the quantum processor can be represented as a node associated with a tensor in the hypergraph. A tensor can be an element of a tensor product of a finite number of vector spaces over a common field. As such, a tensor can be a multilinear map for a gate of the quantum processor. Additionally or alternatively, the visualization data 114 can include the assembly code associated with the quantum programming process. For instance, the visualization data can include the textual data for the quantum processor. In an embodiment, the visualization component 106 can display the visualization data 114 via a user interface. For example, the visualization component 106 can display the visualization data 114 via a graphical user interface of a display device. The display device can be a user device such as, for example, a computing device, a computer, a desktop computer, a laptop computer, a monitor device, a smart device, a smart phone, a mobile device, a handheld device, a tablet, a portable computing device or another type of device associated with a display.

In an embodiment, the visualization component 106 can display, via the user interface, first visualization data associated with the topology data in parallel to second visualization data associated with the assembly code for the quantum programming process. For example, the visualization component 106 can display, via the user interface, first visualization data associated with the set of planar slice elements in parallel to second visualization data associated with assembly code for the quantum programming process. In another embodiment, the visualization component 106 can generate the visualization data 114 based on a scrolling action provided via the user interface. For example, the visualization component 106 can generate the visualization data 114 by moving the visualization via scrolling to match the first visualization data associated with the topology data and the second visualization data associated with the assembly code for the quantum programming process. In an aspect, the visualization component 106 can provide different topology data and/or different graphical representations for different quantum processors. For example, the visualization component 106 can generate different topologies and/or different graphical representations (e.g., for display via a user interface) for different quantum processors. In certain embodiments, the visualization component 106 can generate the visualization data 114 via a cloud-based quantum computing platform. For example, the visualization component 106 can be implemented on a cloud-based quantum computing platform. Furthermore, the visualization component 106 can transmit the visualization data 114 to a display device in communication with the cloud-based quantum computing platform. The display device can render the visualization data 114 via a user interface associated with a display of the display device. In certain embodiments, the visualization component 106 can generate the visualization data 114 via digital video processing. For example, at least a portion of the visualization data 114 can be provided as a digital video script.

In certain embodiments, the visualization component 106 can generate the visualization data 114 based on classifications, correlations, inferences and/or expressions associated with principles of artificial intelligence. For instance, the visualization component 106 can employ an automatic classification system and/or an automatic classification process to generate the visualization data 114. In one example, the visualization component 106 can employ a probabilistic and/or statistical-based analysis (e.g., factoring into the analysis utilities and costs) to learn and/or generate inferences with respect to the visualization data 114. In an aspect, the visualization component 106 can include an inference component (not shown) that can further enhance aspects of the visualization component 106 utilizing in part inference-based schemes to facilitate learning and/or generating inferences associated with the visualization data 114. The visualization component 106 can employ any suitable machine-learning based techniques, statistical-based techniques and/or probabilistic-based techniques. For example, the visualization component 106 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the visualization component 106 can perform a set of machine learning computations associated with generation of the visualization data 114. For example, the visualization component 106 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations to generate the visualization data 114.

It is to be appreciated that the quantum composer component 102 (e.g., the quantum programming component 104 and/or the visualization component 106) performs a quantum composer process and/or a visualization process that cannot be performed by a human (e.g., is greater than the capability of a single human mind). For example, an amount of data processed, a speed of data processed and/or data types of data processed by the quantum composer component 102 (e.g., the quantum programming component 104 and/or the visualization component 106) over a certain period of time can be greater, faster and different than an amount, speed and data type that can be processed by a single human mind over the same period of time. The quantum composer component 102 (e.g., the quantum programming component 104 and/or the visualization component 106) can also be fully operational towards performing one or more other functions (e.g., fully powered on, fully executed, etc.) while also performing the above-referenced quantum composer process and/or visualization process. Moreover, visualization data 114 generated by the quantum composer component 102 (e.g., the quantum programming component 104 and/or the visualization component 106) can include information that is impossible to obtain manually by a user. For example, a type of information included in the visualization data 114, and/or a variety of information included in the visualization data 114 can be more complex than information obtained manually by a user.

Additionally, it is to be appreciated that the system 100 can provide various advantages as compared to conventional quantum processor design techniques. The system 100 can also provide various solutions to problems associated with conventional quantum design techniques. For instance, an amount of time to design a quantum processor can be reduced by employing the system 100 (e.g., the visualization component 106 can generate the visualization data 114 to reduce an amount of processing for a design process associated with the quantum processor, etc.). Furthermore, an amount of computational resources employed to design and/or simulate a quantum processor can be reduced by employing the system 100. A design of a quantum processor can also be optimized by employing the system 100. Additionally, accuracy of a quantum processor design and/or efficiency of quantum processor design can be improved. Moreover, quality of a quantum processor can be improved, performance a quantum processor can be improved, efficiency of a quantum processor can be improved, timing characteristics of a quantum processor can be improved, power characteristics of a quantum processor can be improved, and/or another characteristic of a quantum processor can be improved by employing the system 100.

Figure 2:
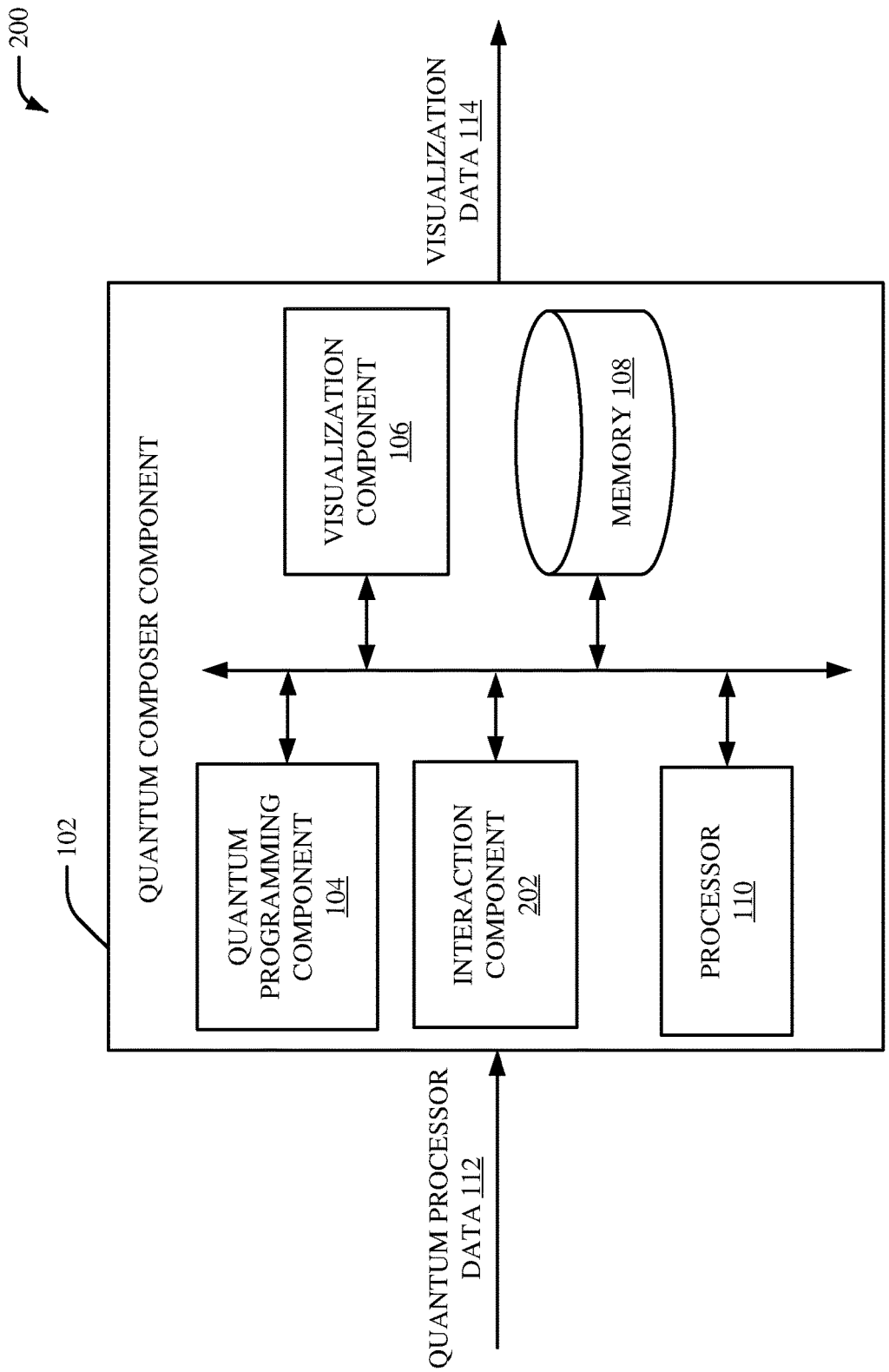
FIG. 2 illustrates a block diagram of another example, non-limiting system that includes a quantum composer component in accordance with one or more embodiments described herein.

FIG. 2 illustrates a block diagram of an example, non-limiting system 200 in accordance with one or more embodiments described herein. Repetitive description of like elements employed in other embodiments described herein is omitted for sake of brevity.

The system 200 includes the quantum composer component 102. The quantum composer component 102 shown in FIG. 2 can include the quantum programming component 104, the visualization component 106, an interaction component 202, the memory 108, and/or the processor 110. The interaction component 202 can facilitate interaction with the visualization data 114 via the user interface that displays the visualization data 114. In an aspect, the interaction component 202 can provide an interaction via the user interface between the visualization data 114 and the quantum programming process associated with the quantum processor data 112. For example, the interaction component 202 can provide an interaction via the user interface between the visualization data 114 and the assembly code of the quantum programming process associated with the quantum processor data 112. In an embodiment, the interaction component 202 can modify the quantum programming process based on a modification of the visualization data 114 via the user interface. For instance, the interaction component 202 can modify the assembly code for the quantum programming process based on a modification of the visualization data 114 via the user interface. In another embodiment, the interaction component 202 can modify the visualization data 114 based on a modification of the quantum programming process via the user interface. For instance, the interaction component 202 can modify the visualization data 114 based on a modification to the assembly code for the quantum programming process via the user interface. In an aspect, the interaction component 202 can synchronize the visualization data 114 on the user interface with assembly code for the quantum programming process. For example, the interaction component 202 can scroll a portion of the visualization data 114 displayed on the user interface in response to scrolling of the assembly code for the quantum programming process via the user interface. In another example, scrolling of the assembly code for the quantum programming process can be matched with the visualization data 114 presented via the user interface. In another aspect, the interaction component 202 can modify the visualization data 114 and/or assembly code associated with the quantum programming process based on a scrolling action associated with the user interface. In yet another aspect, the interaction component 202 can manipulate the visualization data 114 to create and/or edit one or more portions of the assembly code for the quantum programming process. In yet another aspect, the interaction component 202 can allow the visualization data 114 and/or the assembly code for the quantum programming process to be navigated via the user interface. For example, the visualization data 114 and/or the assembly code for the quantum programming process can be scrolled to view different phases of the quantum processor.

Additionally, it is to be appreciated that the system 200 can provide various advantages as compared to conventional quantum processor design techniques. The system 200 can also provide various solutions to problems associated with conventional quantum design techniques. For instance, an amount of time to design a quantum processor can be reduced by employing the system 200. Furthermore, an amount of computational resources employed to design and/or simulate a quantum processor can be reduced by employing the system 200. A design of a quantum processor can also be optimized by employing the system 200. Additionally, accuracy of a quantum processor design and/or efficiency of quantum processor design can be improved. Moreover, quality of a quantum processor can be improved, performance a quantum processor can be improved, efficiency of a quantum processor can be improved, timing characteristics of a quantum processor can be improved, power characteristics of a quantum processor can be improved, and/or another characteristic of a quantum processor can be improved by employing the system 200.

Figure 3:
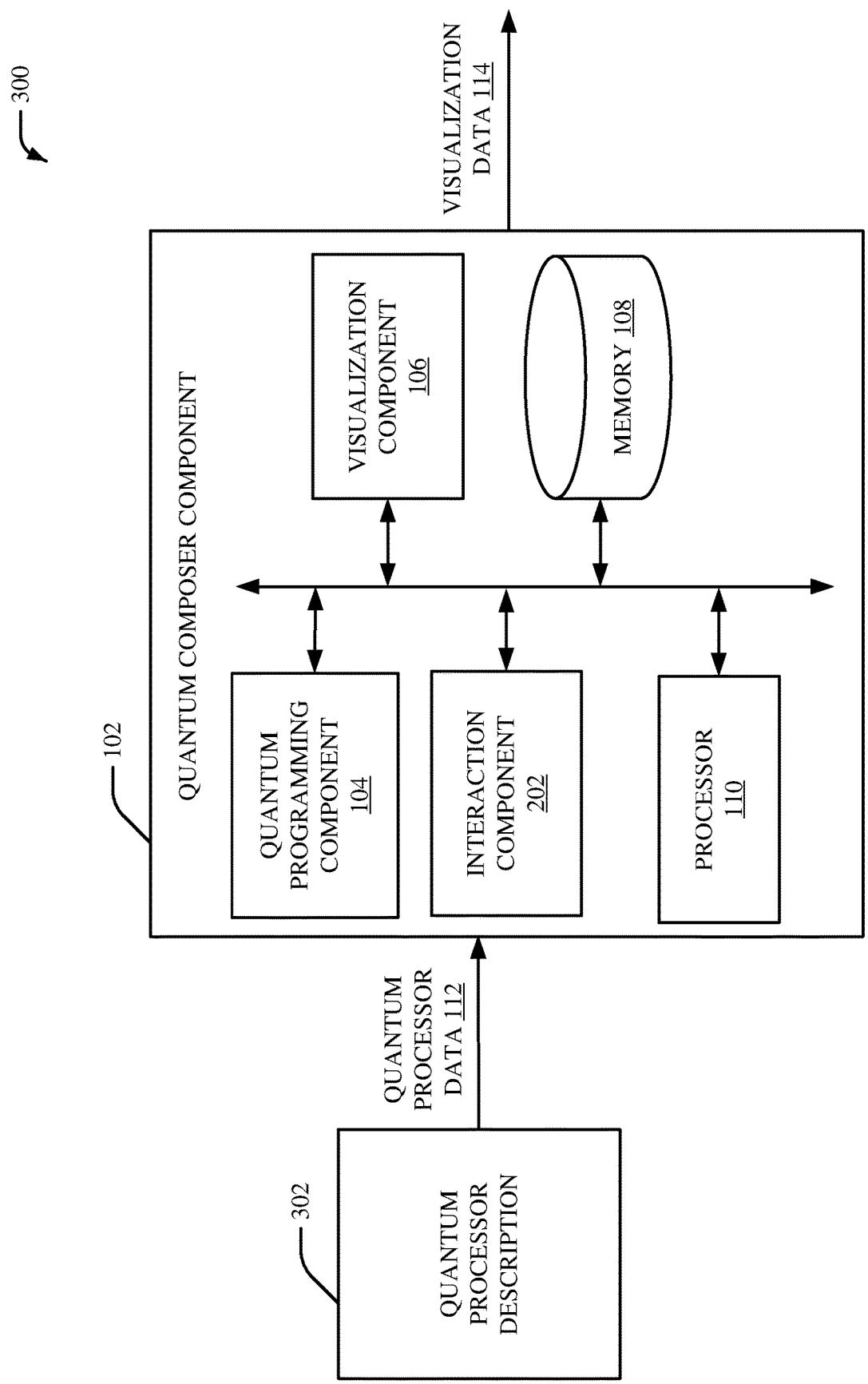
FIG. 3 illustrates a block diagram of yet another example, non-limiting system that includes a quantum composer component and a quantum processor description in accordance with one or more embodiments described herein.

FIG. 3 illustrates a block diagram of an example, non-limiting system 300 in accordance with one or more embodiments described herein. Repetitive description of like elements employed in other embodiments described herein is omitted for sake of brevity.

The system 300 includes the quantum composer component 102 and a quantum processor description 302. The quantum composer component 102 shown in FIG. 3 can include the quantum programming component 104, the visualization component 106, the interaction component 202, the memory 108, and/or the processor 110. The quantum processor description 302 can be a description of a processor that performs a set of calculations based on principle of quantum physics. For example, the quantum processor description 302 can be associated with a text-format language (e.g., a QASM text-format language) that describes a quantum processor. In an aspect, a quantum processor associated with the quantum processor description 302 can encode and/or process information using qubits. In one embodiment, a quantum processor associated with the quantum processor description 302 can be a hardware quantum processor that executes a set of instruction threads associated with qubits. In another embodiment, a quantum processor associated with the quantum processor description 302 can be a qubit device and/or a qubit unit cell that can encode and/or process information using qubits. For instance, a quantum processor associated with the quantum processor description 302 can be a qubit device and/or a qubit unit cell that executes a set of instruction threads associated with qubits. In an aspect, the quantum processor description 302 can include one or more quantum elements. The one or more quantum elements can include, for example, a qubit element of a quantum processor associated with the quantum processor description 302, a coupler of a quantum processor associated with the quantum processor description 302, a readout of a quantum processor associated with the quantum processor description 302, a bus of a quantum processor associated with the quantum processor description 302, and/or another quantum element of a quantum processor associated with the quantum processor description 302. In certain embodiments, at least a portion of the quantum processor description 302 can be determined and/or provided via a user interface (e.g., a user interface of a display device).

It is to be appreciated that the system 300 can provide various advantages as compared to conventional quantum processor design techniques. The system 300 can also provide various solutions to problems associated with conventional quantum design techniques. For instance, an amount of time to design a quantum processor can be reduced by employing the system 300. Furthermore, an amount of computational resources employed to design and/or simulate a quantum processor can be reduced by employing the system 300. A design of a quantum processor can also be optimized by employing the system 300. Additionally, accuracy of a quantum processor design and/or efficiency of quantum processor design can be improved. Moreover, quality of a quantum processor can be improved, performance a quantum processor can be improved, efficiency of a quantum processor can be improved, timing characteristics of a quantum processor can be improved, power characteristics of a quantum processor can be improved, and/or another characteristic of a quantum processor can be improved by employing the system 300.

Figure 4:
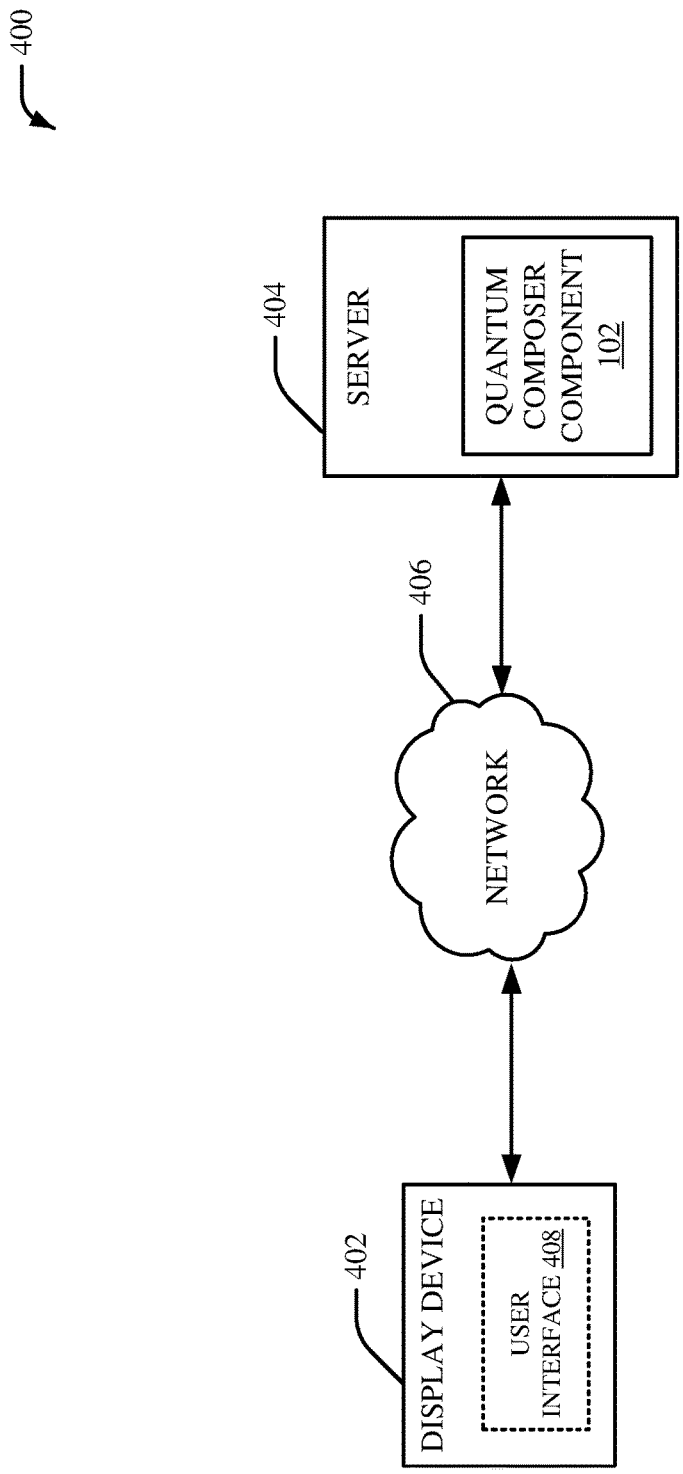
FIG. 4 illustrates an example, non-limiting system associated with a display device and a server in accordance with one or more embodiments described herein.

FIG. 4 illustrates a block diagram of an example, non-limiting system 400 in accordance with one or more embodiments described herein. Repetitive description of like elements employed in other embodiments described herein is omitted for sake of brevity.

The system 400 includes a display device 402 and a server 404. The display device 402 can be in communication with the server 404 via a network 406. Furthermore, the display device 402 can be a user device such as, for example, a computing device, a computer, a desktop computer, a laptop computer, a monitor device, a smart device, a smart phone, a mobile device, a handheld device, a tablet, a portable computing device or another type of device associated with a display. The network 406 can be a communication network, a wireless network, a wired network, an internet protocol (IP) network, a voice over IP network, an internet telephony network, a mobile telecommunications network and/or another type of network. The server 404 can include the quantum composer component 102. The quantum composer component 102 can include, for example, the quantum programming component 104, the visualization component 106, the interaction component 202, the memory 108, and/or the processor 110. In an embodiment, the server 404 can be a cloud-based quantum computing platform. In an embodiment, the display device 402 can include a user interface 408. For example, the user interface 408 can be a graphical user interface. The user interface 408 can display visualization data (e.g., visualization data 114) provided by the quantum composer component 102. For example, the quantum composer component 102 implemented on the server 404 can transmit, via the network 406, visualization data (e.g., visualization data 114) to the display device 402 for display on the user interface 408.

It is to be appreciated that the system 400 can provide various advantages as compared to conventional quantum processor design techniques. The system 400 can also provide various solutions to problems associated with conventional quantum design techniques. For instance, an amount of time to design a quantum processor can be reduced by employing the system 400. Furthermore, an amount of computational resources employed to design and/or simulate a quantum processor can be reduced by employing the system 400. A design of a quantum processor can also be optimized by employing the system 400. Additionally, accuracy of a quantum processor design and/or efficiency of quantum processor design can be improved. Moreover, quality of a quantum processor can be improved, performance a quantum processor can be improved, efficiency of a quantum processor can be improved, timing characteristics of a quantum processor can be improved, power characteristics of a quantum processor can be improved, and/or another characteristic of a quantum processor can be improved by employing the system 400.

Figure 5:
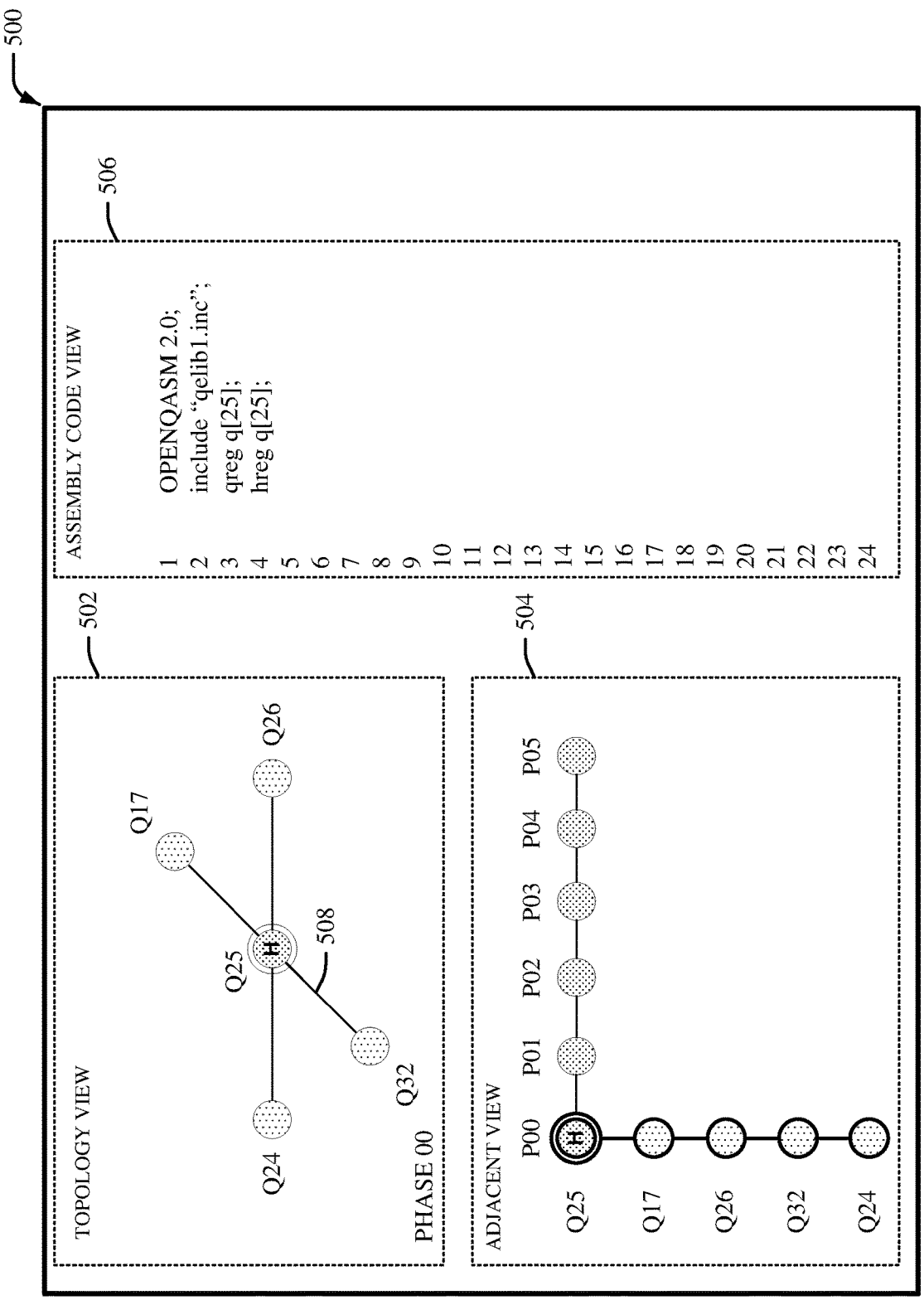
FIG. 5 illustrates an example, non-limiting user interface in accordance with one or more embodiments described herein.

FIG. 5 illustrates a block diagram of an example, non-limiting user interface 500 in accordance with one or more embodiments described herein. Repetitive description of like elements employed in other embodiments described herein is omitted for sake of brevity.

The user interface 500 can be, for example, a user interface (e.g., user interface 408) for a display device (e.g., display device 402). For example, the user interface 500 can be a user interface for a computing device, a computer, a desktop computer, a laptop computer, a monitor device, a smart device, a smart phone, a mobile device, a handheld device, a tablet, a portable computing device or another type of device associated with a display. In one example, the user interface 500 can be a graphical user interface. The user interface 500 includes a topology view 502, an adjacent view 504 and an assembly code view 506. The topology view 502 and/or the adjacent view can present at least a portion of visualization data (e.g., visualization data 114) generated by the quantum composer component 102. The topology view 502 can present a topology view for at least a portion of a quantum processor. The adjacent view 504 can present an adjacent view for at least a portion of a quantum processor. The topology view 502 and the adjacent view 504 can present a corresponding portion of a quantum processor. In an aspect, the topology view 502 can present topology data for a quantum processor. For instance, the topology view 502 can present a physical topology of a set of qubits associated with the quantum processor. In a non-limiting example, the topology view 502 can present a physical topology of a perspective view for a qubit Q17, a qubit Q24, a qubit Q25, a qubit Q26 and a qubit Q32. In another example, the topology view 502 can present a physical topology of a flat view for the qubit Q17, the qubit Q24, the qubit Q25, the qubit Q26 and the qubit Q32. For instance, the qubit Q17 can be represented as a first node in a graphical representation of a quantum processor, the qubit Q24 can be represented as a second node in the graphical representation of the quantum processor, the qubit Q25 can be represented as a third node in the graphical representation of the quantum processor, the qubit Q26 can be represented as a fourth node in the graphical representation of the quantum processor, and the qubit Q32 can be represented as a fifth node in the graphical representation of the quantum processor. The graphical representation can be presented as a perspective view of the quantum processor, a flat view of the quantum processor, an isometric view of the quantum processor, or another view of quantum processor. The qubit Q17, the qubit Q24, the qubit Q25, the qubit Q26 and the qubit Q32 can also be associated with a set of edges. For example, the qubit Q25 and the qubit Q32 can be connected by an edge 508. Furthermore, the topology view 502 can represent a particular qubit phase (e.g., phase 00) for the quantum processor. In an embodiment, the qubit Q17, the qubit Q24, the qubit Q25, the qubit Q26 and the qubit Q32 can be a set of planar slice elements that indicate one or more operations performed at a time step associated with the quantum processor and/or a quantum programming process associated with the assembly code view 506. In one example, the qubit Q25 can be formatted as a Hadamard gate (e.g., "H" gate). For instance, a user can apply the Hadamard gate to the qubit Q25 via the topology view 502 of the user interface 500. In certain embodiments, a user can hover a cursor over the qubit Q25 in the topology view 502 to initiate viewing a set of qubit gates available for entanglement for the qubit Q25. In certain embodiments, the topology view 502 can present a bloch sphere representing a selected qubit. In certain embodiments, a user can scroll down in the topology view 502 to select a qubit in a different qubit phase (e.g., Phase 02).

The adjacent view 504 can present an entire topology for the quantum processor associated with the topology view 502. For instance, the adjacent view 504 can present a physical topology of an adjacent view for the qubit Q17, the qubit Q24, the qubit Q25, the qubit Q26 and the qubit Q32. As such, a user that employs the user interface 500 can, for example, focus on a set of qubits (e.g., qubit Q17, the qubit Q24, the qubit Q25, the qubit Q26 and the qubit Q32) in perspective of time as well as interactivity between the set of qubits. In an aspect, the adjacent view 504 can illustrate qubits in different qubit phases for the quantum processor. For instance, the adjacent view 504 can illustrate the qubit Q17, the qubit Q24, the qubit Q25, the qubit Q26 and the qubit Q32 in the qubit phase P00. In an embodiment, a user can select a qubit shown in the topology view 502 via the adjacent view 504. For example, a user can select the qubit Q25 in the adjacent view 504 to modify the qubit Q25 shown in the topology view 502. In certain embodiments, in response to a user selecting a different qubit phase (e.g., qubit phase P02) in the adjacent view 504, the topology view 502 can select a qubit (e.g. qubit Q25) on the corresponding different qubit phase (e.g., qubit phase P02) and scroll down. In another example, a user can remove a qubit shown in the topology view 502 via the adjacent view 504 (e.g., by dragging the qubit out from the adjacent view 504). In response to removal of the qubit shown in the topology view 502 via the adjacent view 504, the assembly code view 506 can also be updated accordingly. The assembly code view 506 can present assembly code for a quantum programming process associated with the quantum processor shown in the topology view 502 and/or the adjacent view 504. For instance, the assembly code view 506 can include textual data (e.g., assembly code) indicative of a text-format language (e.g., a QASM text-format language) that describes the qubits (e.g., the qubit Q17, the qubit Q24, the qubit Q25, the qubit Q26 and the qubit Q32) shown in the topology view 502 and/or the adjacent view 504. For instance, the textual data shown in the assembly code view 506 can, for example, textually describe and/or format the qubit Q17, the qubit Q24, the qubit Q25, the qubit Q26 and the qubit Q32 shown in the topology view 502 and/or the adjacent view 504. In an embodiment, the topology view 502 and/or the adjacent view 504 can be presented on the user interface 500 in parallel to the assembly code view 506. In another embodiment, the assembly code and/or the quantum programming process shown in the assembly code view 506 can be modified based on modification of one or more portions of the topology view 502 and/or the adjacent view 504. For example, the assembly code and/or the quantum programming process shown in the assembly code view 506 can be modified based on modification of a qubit (e.g., qubit Q25, etc.) shown in the topology view 502 and/or the adjacent view 504. Additionally or alternatively, one or more portions of the topology view 502 and/or the adjacent view 504 can be modified based on modification of the assembly code and/or the quantum programming process shown in the assembly code view 506. For example, a qubit (e.g., qubit Q25, etc.) shown in the topology view 502 and/or the adjacent view 504 can be modified based on modification of corresponding assembly code shown in the assembly code view 506. In an embodiment, interaction with data in the topology view 502, the adjacent view 504 and/or the code view 506 can initiate an update in the topology view 502, the adjacent view 504 and the code view 506 per data change. As such, the topology view 502, the adjacent view 504 and/or the code view 506 can be updated concurrently.

Figure 6:
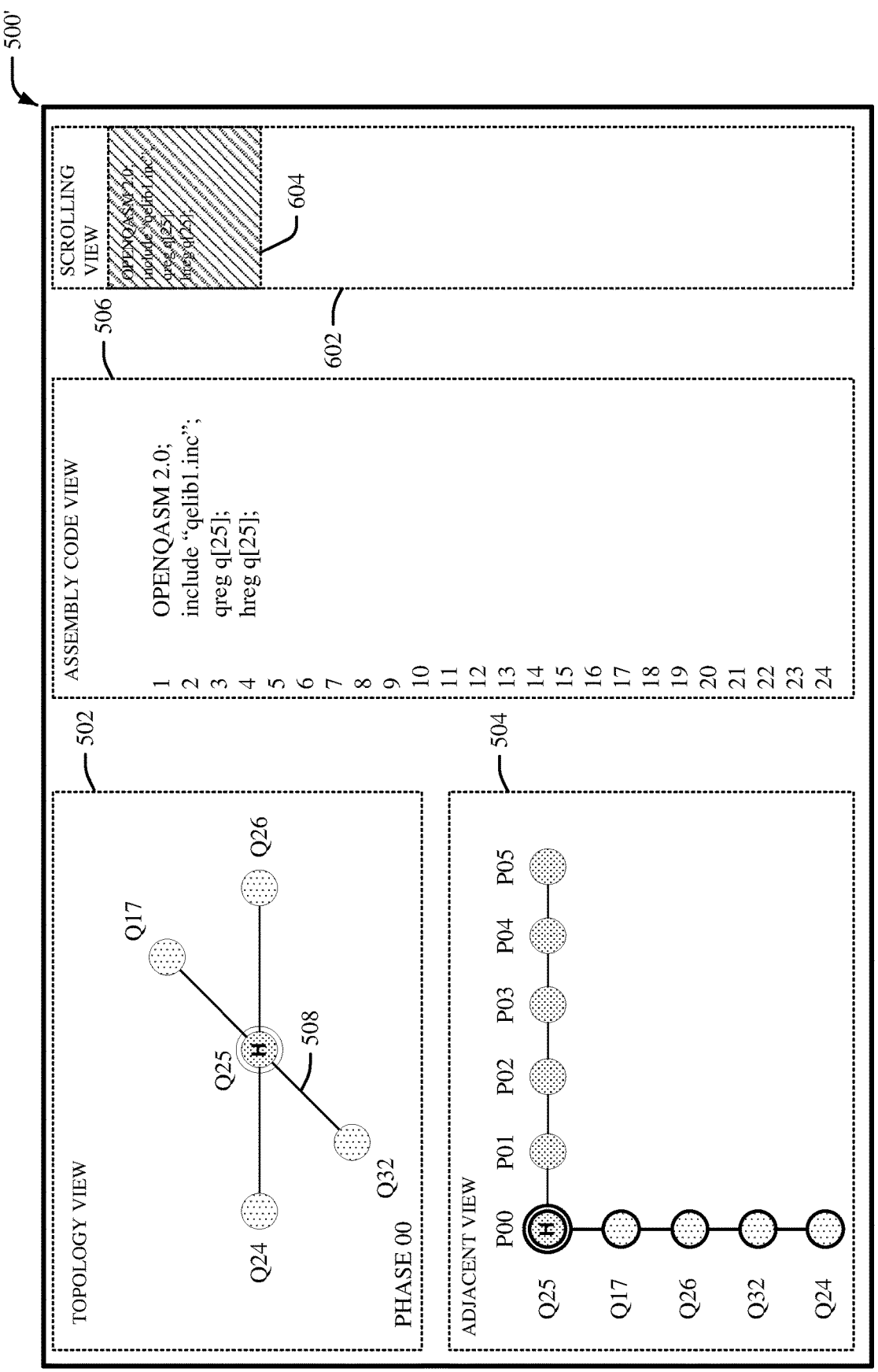
FIG. 6 illustrates another example, non-limiting user interface in accordance with one or more embodiments described herein.

FIG. 6 illustrates a block diagram of an example, non-limiting user interface 500' in accordance with one or more embodiments described herein. Repetitive description of like elements employed in other embodiments described herein is omitted for sake of brevity.

The user interface 500' can be an alternate embodiment of the user interface 500. The user interface 500' can include the topology view 502, the adjacent view 504, the assembly code view 506 and a scrolling view 602. The scrolling view 602 can be employed to scroll through the assembly code view 506. Furthermore, in response to scrolling via the scrolling view 602, a view of the topology view 502 and/or the adjacent view 504 can be modified. In an aspect, the scrolling view 602 can include a highlighted section 604 that illustrates a portion of the assembly code shown in the assembly code view 506 and/or a portion of the quantum processor shown in the topology view 502 and the adjacent view 504. In another aspect, a scrolling action can be performed by a user via the scrolling view 602. The topology view 502, the adjacent view 504 and/or the assembly code view 506 can be updated based on the scrolling action. The scrolling action can be an action of moving the highlighted section 604 to provide moving of the assembly text associated with the assembly code view and/or moving of a visualization associated with the topology view 502 and/or the adjacent view 504. In an embodiment, the scrolling action associated with the scrolling view 602 can allow different phases of the quantum processor associated with the topology view 502 and the adjacent view 504 to be navigated. As such, scrolling of the topology view 502, the adjacent view 504 and/or the assembly code view 506 can be matched.

Figure 7:
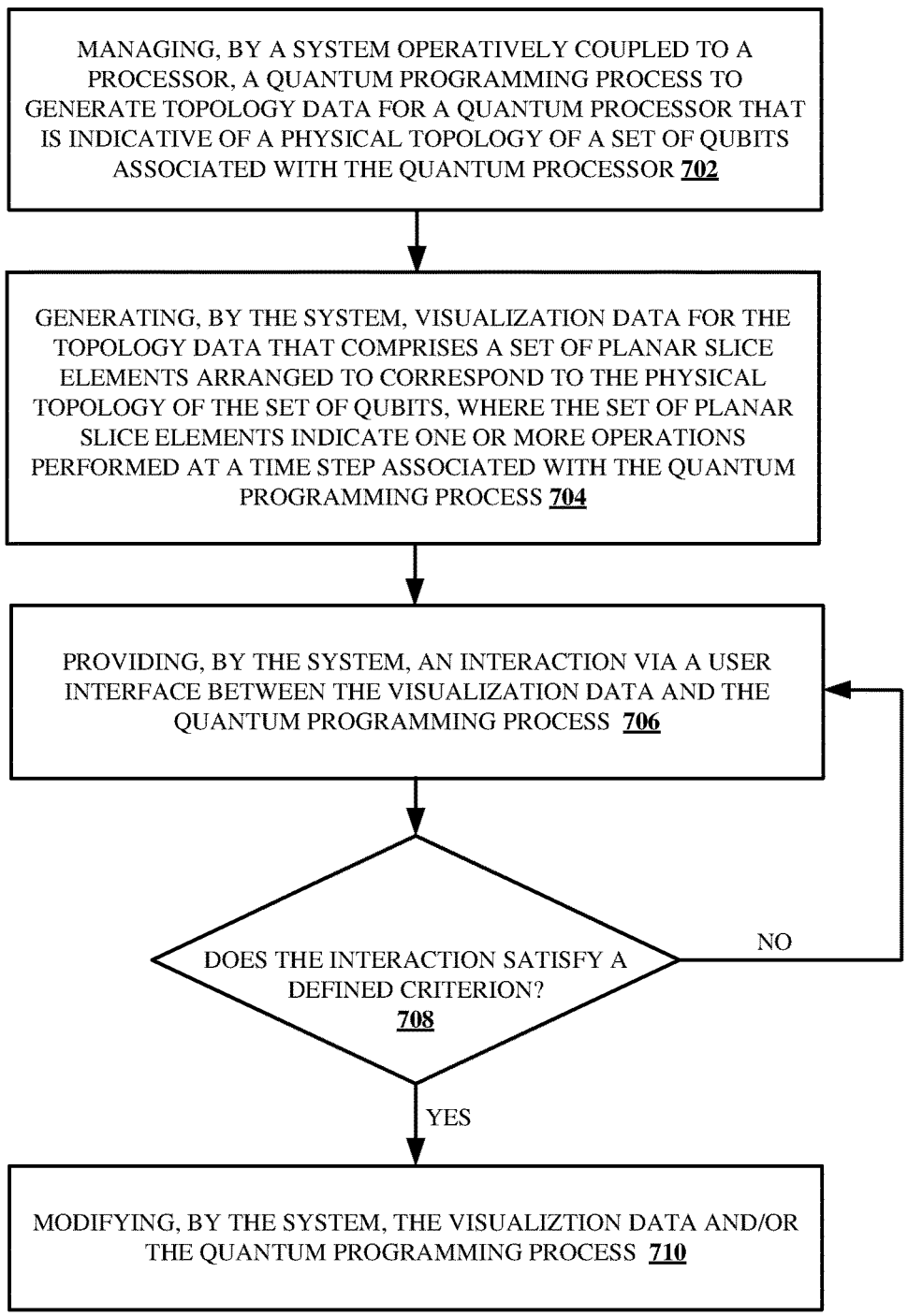
FIG. 7 illustrates a flow diagram of an example, non-limiting computer-implemented method for facilitating visualization and/or interaction with a quantum processor in accordance with one or more embodiments described herein.

FIG. 7 illustrates a flow diagram of an example, non-limiting computer-implemented method 700 for facilitating visualization and/or interaction with a quantum processor in accordance with one or more embodiments described herein. At 702, a quantum programming process to generate topology data for a quantum processor that is indicative of a physical topology of a set of qubits associated with the quantum processor is managed, by a system operatively coupled to a processor (e.g., by quantum programming component 104). The quantum programming process can assemble a sequence of instructions (e.g., one or more quantum programs) that can be executed on the quantum processor. In an aspect, the quantum programming process can manage the topology data. For instance, the quantum programming process can manage assembly code associated with the topology data. The assembly code can include the textual data indicative of the text-format language (e.g., the QASM text-format language) that describes the quantum processor. In an example, the assembly code can textually describe one or more qubit gates of the quantum processor.

At 704, visualization data for the topology data that comprises a set of planar slice elements arranged to correspond to the physical topology of the set of qubits is generated by the system (e.g., by visualization component 106). The set of planar slice elements indicate one or more operations performed at a time step associated with the quantum programming process. In an embodiment, the visualization data can include a set of nodes associated with the set of planar slice elements and/or a set of edges associated with the set of planar slice elements. The set of nodes can represent the set of qubits for the quantum processor. The set of edges can represent a set of connections between qubits from the set of qubits. In an aspect, the visualization data can be formatted as graphical data for the quantum processor. The graphical data can be indicative of a graphical representation of the quantum processor. In an embodiment, the graphical representation can be formatted as a hypergraph. For example, the graphical data can graphically represent the quantum processor as a hypergraph. The hypergraph for the quantum processor can include the set of nodes and a set of edges. The set of nodes can be a set of vertices (e.g., a set of points) of the hypergraph. The set of edges can connect two or more nodes from the set of nodes. In an aspect, a node of the hypergraph can represent a tensor associated with the quantum processor. For example, a gate of the quantum processor can be represented as a node associated with a tensor in the hypergraph. A tensor can be an element of a tensor product of a finite number of vector spaces over a common field. As such, a tensor can be a multilinear map for a gate of the quantum processor.

At 706, an interaction via a user interface is provided, by the system (e.g., by interaction component 202), between the visualization data and the quantum programming process. For example, the visualization data can be displayed in parallel with assembly code for the quantum programming process. Furthermore, a user can interact with the visualization data and/or the assembly code for the quantum programming process via the user interface. The user interface can be a graphical user interface. Furthermore, the user interface can be implemented on a display device such as a computing device, a computer, a desktop computer, a laptop computer, a monitor device, a smart device, a smart phone, a mobile device, a handheld device, a tablet, a portable computing device or another type of device associated with a display. In aspect, the visualization data and/or the assembly code for the quantum programming process can be navigated via the user interface. For example, the visualization data and/or the assembly code for the quantum programming process can be scrolled to view different phases of the quantum processor. In an embodiment, at least a portion of the visualization data and assembly code associated with the quantum programming process can be synchronized via the user interface.

At 708, it is determined whether the interaction satisfies a defined criterion. For example, it can be determined whether a scrolling action is performed via the interaction. If no, the computer-implemented method 700 returns to 706. If yes, the computer-implemented method 700 proceeds to 710.

At 710, the visualization data and/or the quantum programming process is modified by the system (e.g., by interaction component 202). For instance, the assembly code for the quantum programming process can be modified based on a modification of the visualization data via the user interface. In one example, a view for a portion of the visualization data displayed on the user interface can be modified in response to scrolling of the assembly code for the quantum programming process via the user interface. In another example, scrolling of the assembly code for the quantum programming process can be matched with the visualization data presented via the user interface. In another aspect, the visualization data can be manipulated to create and/or edit one or more portions of the assembly code for the quantum programming process. In yet another aspect, a portion of the visualization data can be modified in response to modification of a corresponding portion of the assembly code for the quantum programming process. In certain embodiments, the providing the interaction via the user interface and/or the modifying the visualization data and/or the quantum programming process can include reducing an amount of processing for a design process associated with the quantum processor.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because at least generating visualization data, modifying visualization data, providing an interaction via a user interface, etc. are established from a combination of electrical and mechanical components and circuitry, a human is unable to replicate or perform processing performed by the quantum composer component 102 (e.g., the quantum programming component 104, the visualization component 106, and/or the interaction component 202) disclosed herein. For example, a human is unable to generate visualization data for a quantum processor, etc.

Figure 8:
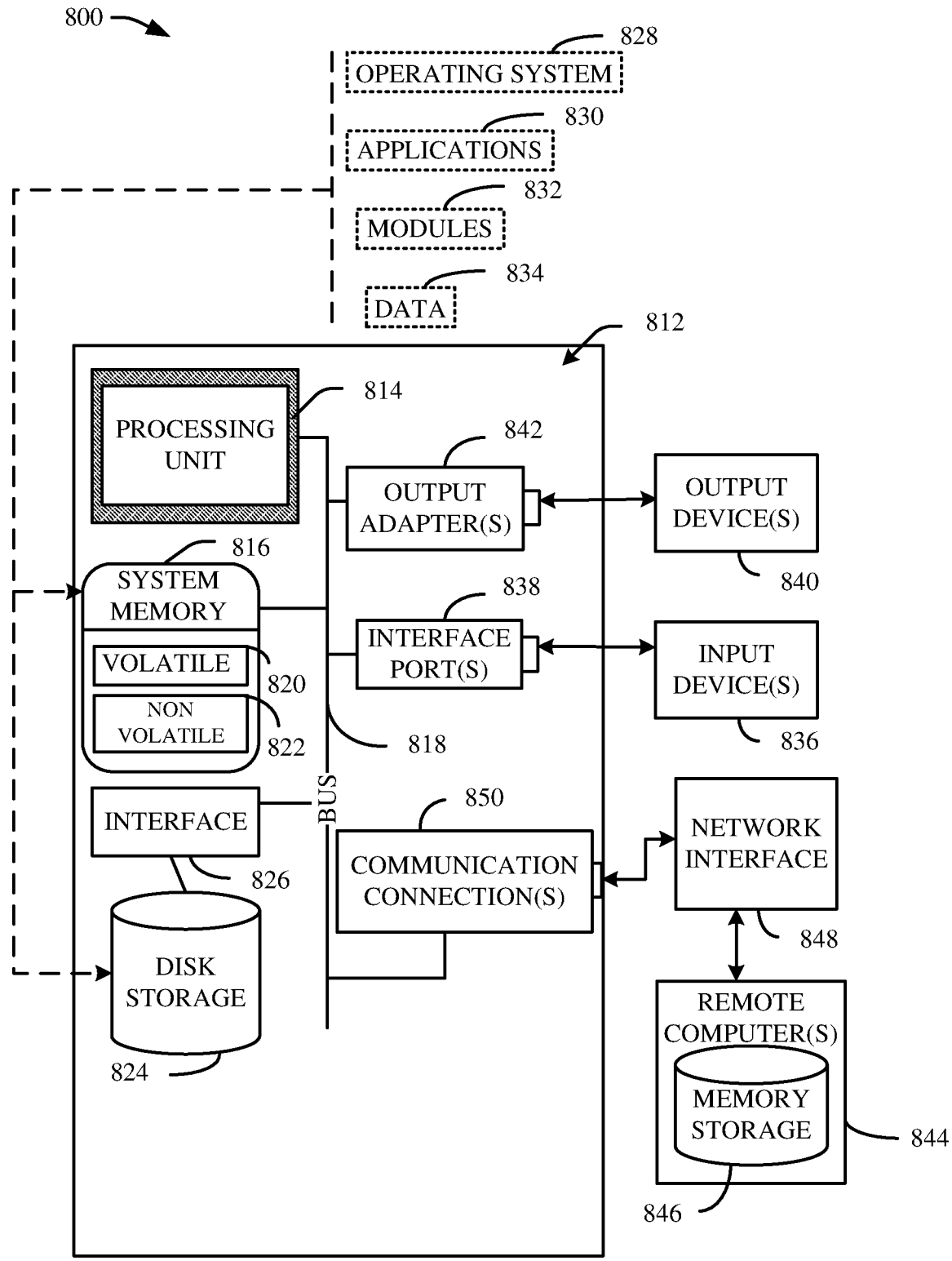
FIG. 8 illustrates a block diagram of an example, non-limiting operating environment in which one or more embodiments described herein can be facilitated.

In order to provide a context for the various aspects of the disclosed subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

With reference to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 816 can also include volatile memory 820 and nonvolatile memory 822. The basic input/output system (BIOS), containing the basic routines to transfer information between elements within the computer 812, such as during start-up, is stored in nonvolatile memory 822. Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media. To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812.

System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor based appliance, a peer device or other common network node and the like, and typically can also include many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Figure 9:
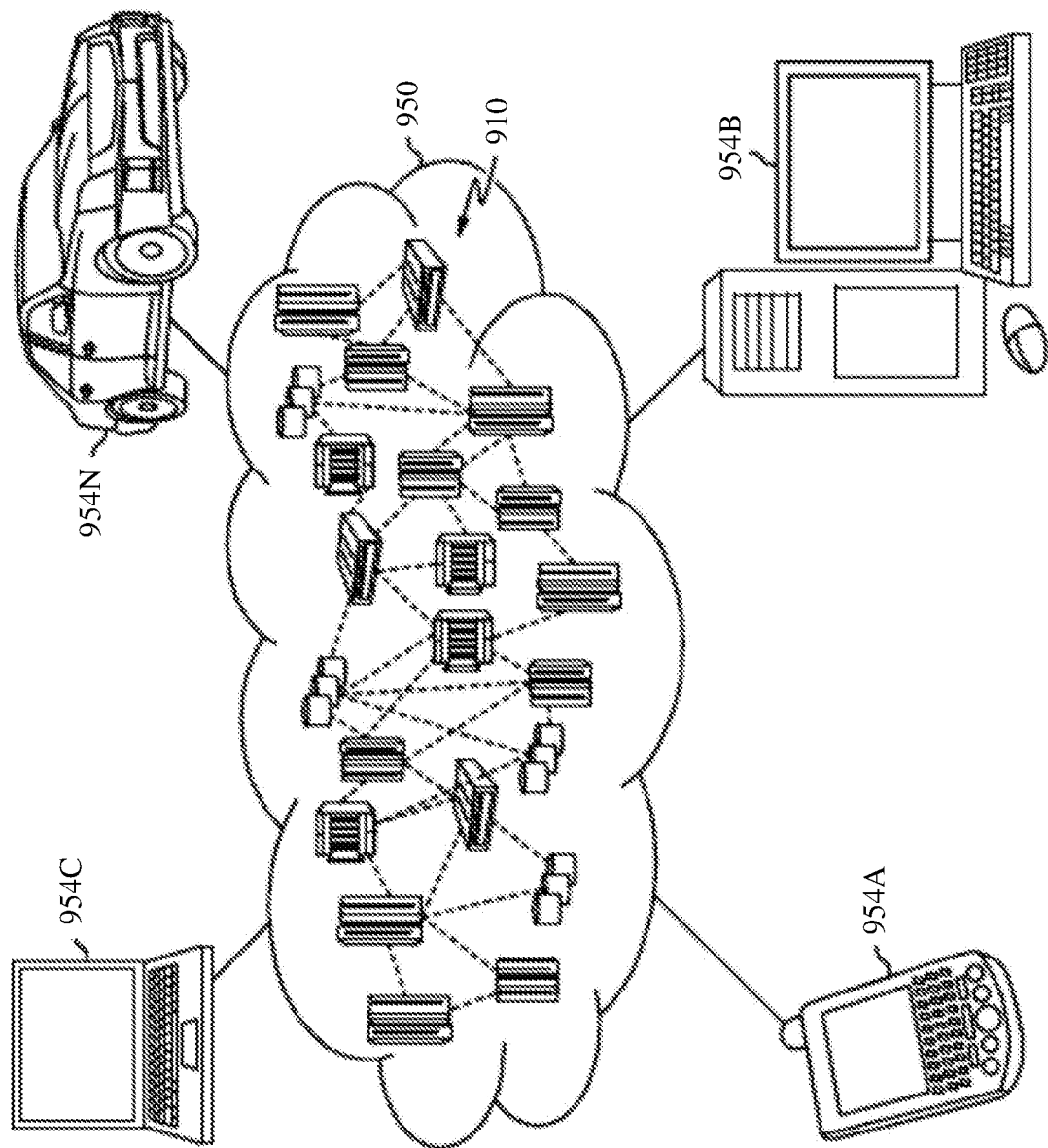
FIG. 9 illustrates a block diagram of an example, non-limiting cloud computing environment in accordance with one or more embodiments of the present invention.

Referring now to FIG. 9, an illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C, and/or automobile computer system 954N may communicate. Nodes 910 may communicate with one another. They may be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that computing nodes 910 and cloud computing environment 950 can communicate with any type of computerized device over any type of network and/or network addressable connection (e.g., using a web browser).

Figure 10:
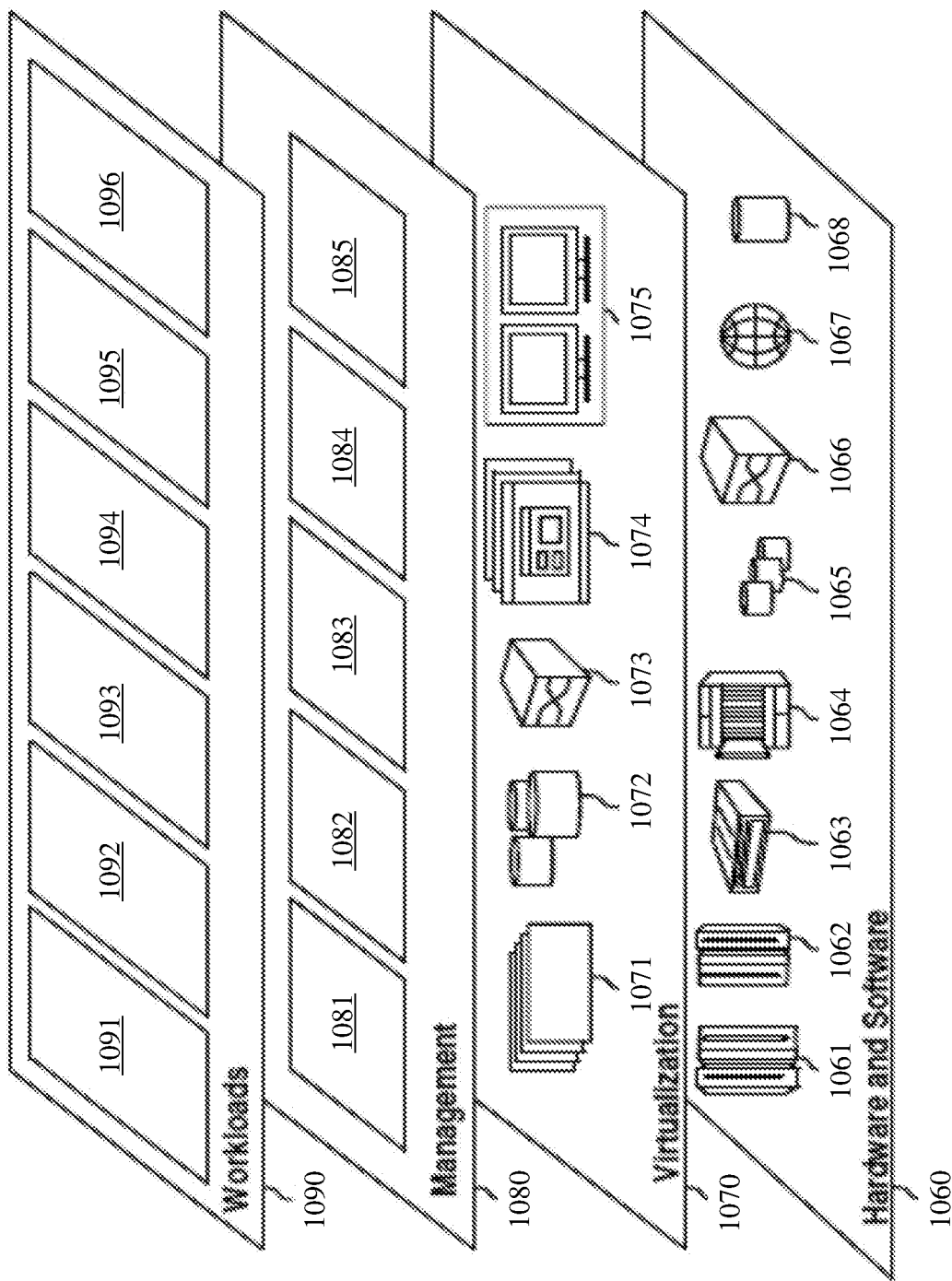
FIG. 10 illustrates a block diagram of example, non-limiting abstraction model layers in accordance with one or more embodiments of the present invention.

Referring now to FIG. 10, a set of functional abstraction layers provided by cloud computing environment 950 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 includes hardware and software components. Examples of hardware components include: mainframes 1061; RISC (Reduced Instruction Set Computer) architecture based servers 1062; servers 1063; blade servers 1064; storage devices 1065; and networks and networking components 1066. In some embodiments, software components include network application server software 1067 and database software 1068.

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In one example, management layer 1080 may provide the functions described below. Resource provisioning 1081 provides dynamic procurement of computing resources and other resources that are utilized to perform tasks within the cloud computing environment. Metering and Pricing 1082 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Non-limiting examples of workloads and functions which may be provided from this layer include: mapping and navigation 1091; software development and lifecycle management 1092; virtual classroom education delivery 1093; data analytics processing 1094; transaction processing 1095; and quantum composer process software 1096.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components;
   a processor that executes computer executable components stored in the memory, wherein the computer executable components comprise:
      a quantum programming component that manages a quantum programming process to generate topology data for a quantum processor that is indicative of a physical topology of a set of qubits associated with the quantum processor; and
      a visualization component that generates visualization data for the topology data that comprises a set of planar slice elements arranged to correspond to the physical topology of the set of qubits, wherein the set of planar slice elements indicate one or more operations performed at a time step associated with the quantum programming process.

2. The system of claim 1, wherein the visualization component provides a set of nodes and a set of edges associated with the set of planar slice elements, wherein the set of nodes represent the set of qubits, and wherein the set of edges represent a set of connections between qubits from the set of qubits.

3. The system of claim 1, wherein the visualization data is first visualization data, and wherein the visualization component generates second visualization data for assembly code associated with the quantum programming process.

4. The system of claim 3, wherein the visualization component displays the first visualization data associated with the set of planar slice elements in parallel to the second visualization data associated with the quantum programming process via a user interface.

5. The system of claim 1, wherein the computer executable components further comprise:
   an interaction component that provides an interaction via a user interface between the visualization data and the quantum programming process.

6. The system of claim 5, wherein the interaction component modifies the quantum programming process based on a modification of the visualization data.

7. The system of claim 5, wherein the interaction component modifies the visualization data or assembly code associated with the quantum programming process based on a scrolling action associated with the user interface.

8. The system of claim 5, wherein the interaction component modifies the visualization data based on modification of assembly code associated with the quantum programming process.

9. The system of claim 1, wherein the quantum programming component generates different topologies for different quantum processors.

10. The system of claim 1, wherein the visualization component generates the visualization data via a cloud-based quantum computing platform.

11. The system of claim 1, wherein the visualization component renders the visualization data via digital video processing.

12. The system of claim 1, wherein the visualization component generates the visualization data to reduce an amount of processing for a design process associated with the quantum processor.

13. A computer-implemented method, comprising:
   managing, by a system operatively coupled to a processor, a quantum programming process to generate topology data for a quantum processor that is indicative of a physical topology of a set of qubits associated with the quantum processor;
   generating, by the system, visualization data for the topology data that comprises a set of planar slice elements arranged to correspond to the physical topology of the set of qubits, wherein the set of planar slice elements indicate one or more operations performed at a time step associated with the quantum programming process; and providing, by the system, an interaction via a user interface between the visualization data and the quantum programming process.

14. The computer-implemented method of claim 13, wherein the computer-implemented method further comprises:
modifying, by the system, the visualization data in response to a determination that the interaction satisfies a defined criterion.

15. The computer-implemented method of claim 13, wherein the computer-implemented method further comprises:
modifying, by the system, the quantum programming process in response to a determination that the interaction satisfies a defined criterion.

16. The computer-implemented method of claim 13, wherein the providing the interaction via the user interface comprises synchronizing at least a portion of the visualization data and assembly code associated with the quantum programming process.

17. The computer-implemented method of claim 13, wherein the providing the interaction via the user interface comprises reducing an amount of processing for a design process associated with the quantum processor.

18. A computer program product for facilitating interaction with a quantum processor, the computer program product comprising a computer readable storage medium having program instructions embodied therewith, the program instructions executable by a processor to cause the processor to:
manage, by the processor, a quantum programming process to generate topology data for the quantum processor that is indicative of a physical topology of a set of qubits associated with the quantum processor;
generate, by the processor, visualization data for the topology data that comprises a set of planar slice elements arranged to correspond to the physical topology of the set of qubits, wherein the set of planar slice elements indicate one or more operations performed at a time step associated with the quantum programming process; and
provide, by the processor, an interaction via a user interface between the visualization data and assembly code associated with the quantum programming process.

19. The computer program product of claim 18, wherein the program instructions are further executable by the processor to cause the processor to:
modify, by the processor, the visualization data in response to a determination that the interaction satisfies a defined criterion.

20. The computer program product of claim 17, wherein the program instructions are further executable by the processor to cause the processor to:
modify, by the processor, the assembly code associated with the quantum programming process in response to a determination that the interaction satisfies a defined criterion.

* * * * *